(12) United States Patent
Rohling et al.

(10) Patent No.: US 7,365,542 B1
(45) Date of Patent: Apr. 29, 2008

(54) FLEXIBLE RF COIL ASSEMBLY AND METHOD OF MAKING SAME

(75) Inventors: Kenneth W. Rohling, Niskayuna, NY (US); Christopher Judson Hardy, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/554,951

(22) Filed: Oct. 31, 2006

(51) Int. Cl.
*G01V 3/00* (2006.01)
(52) U.S. Cl. .................. 324/318; 324/322; 600/421
(58) Field of Classification Search ............ 324/318, 324/322; 600/421, 422
See application file for complete search history.

(56) References Cited

U.S. PATENT DOCUMENTS

| | | | | |
|---|---|---|---|---|
| 5,307,806 A | * | 5/1994 | Jones | 600/422 |
| 5,477,146 A | * | 12/1995 | Jones | 324/318 |
| 5,905,378 A | * | 5/1999 | Giaquinto et al. | 324/318 |

* cited by examiner

*Primary Examiner*—Louis M. Arana
(74) *Attorney, Agent, or Firm*—Jason K. Klindtworth; Curtis B. Brueske (57) ABSTRACT

An RF coil assembly includes a plurality of coil supports rotatably interconnected to each other. Each coil support is configured to rotate with respect to at least one adjoining coil support. A plurality of RF coils is connected to each coil support.

15 Claims, 8 Drawing Sheets

FLEXIBLE RF COIL ASSEMBLY AND METHOD OF MAKING SAME

BACKGROUND OF THE INVENTION

The present invention relates generally to MR imaging and, more particularly, to a flexible RF coil assembly capable of conforming to a patient's shape.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_Z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

It is desired that RF receiver-coil arrays be made light and flexible so that all of the coils can be positioned close to a patient and that patient comfort may be maintained while fitting an RF receiver-coil array to a variety of patient sizes and shapes. However, repeated flexing of RF receiver coils and their corresponding circuitry may alter the performance and shorten the working life of the RF receiver coils.

It would therefore be desirable to have an RF coil apparatus capable of conforming to a patient's shape while protecting the RF receiver coils and corresponding circuitry from repeated flexing.

BRIEF DESCRIPTION OF THE INVENTION

The present invention provides an RF coil apparatus that overcomes the aforementioned drawbacks. An RF coil assembly includes a plurality of coil supports rotatably interconnected to each other. Each coil support is configured to rotate with respect to at least one adjoining coil support. A plurality of RF coils is connected to each coil support.

Therefore, according to an aspect of the present invention, an MRI apparatus includes a magnetic resonance imaging (MRI) system having a plurality of gradient coils positioned about a bore of a magnet to impress spatially dependent changes to a polarizing magnetic field and an RF transceiver system and an RF switch controlled by a pulse module to transmit RF magnetic fields from an RF transmit coil to excite MR signals and to acquire MR signals using an RF receiver coil assembly to create MR images. The RF coil assembly includes a pair of RF coil modules. Each RF coil module includes a set of overlapping RF coils and a housing rigidly supporting the set of overlapping RF coils. The RF coil assembly includes at least one hinge connected to each of the pair of RF coil modules and configured to permit the pair of RF coil modules to rotate between an unflexed position and a flexed position.

According to another aspect of the present invention, an RF coil assembly includes a plurality of RF coil sets. The assembly also includes a plurality of RF coil modules rotatably interconnected to each other, each RF coil module rigidly connected to one of the plurality of RF coil sets and configured to rotate with respect to at least one adjoining RF coil module.

According to a further aspect of the present invention, a method of making an RF coil array includes connecting a first plurality of RF coils to a first rigid support and connecting a second plurality of RF coils to a second rigid support. The method also includes attaching at least one hinge between the first and second rigid supports.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
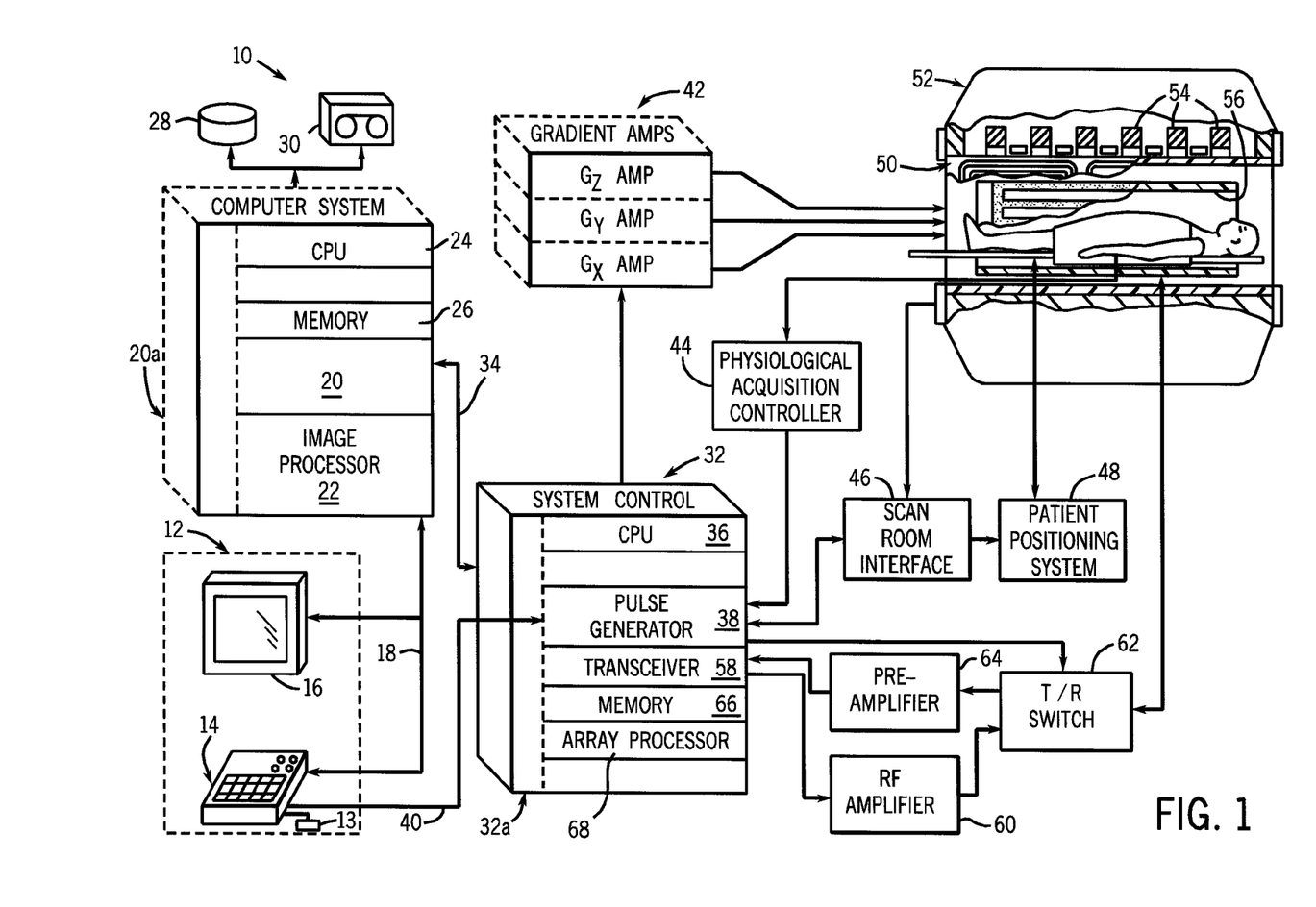
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and removable storage 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the removable storage 30, or it may be further processed by the image processor 22 and conveyed to the operator console 12 and presented on the display 16.

Figure 2:
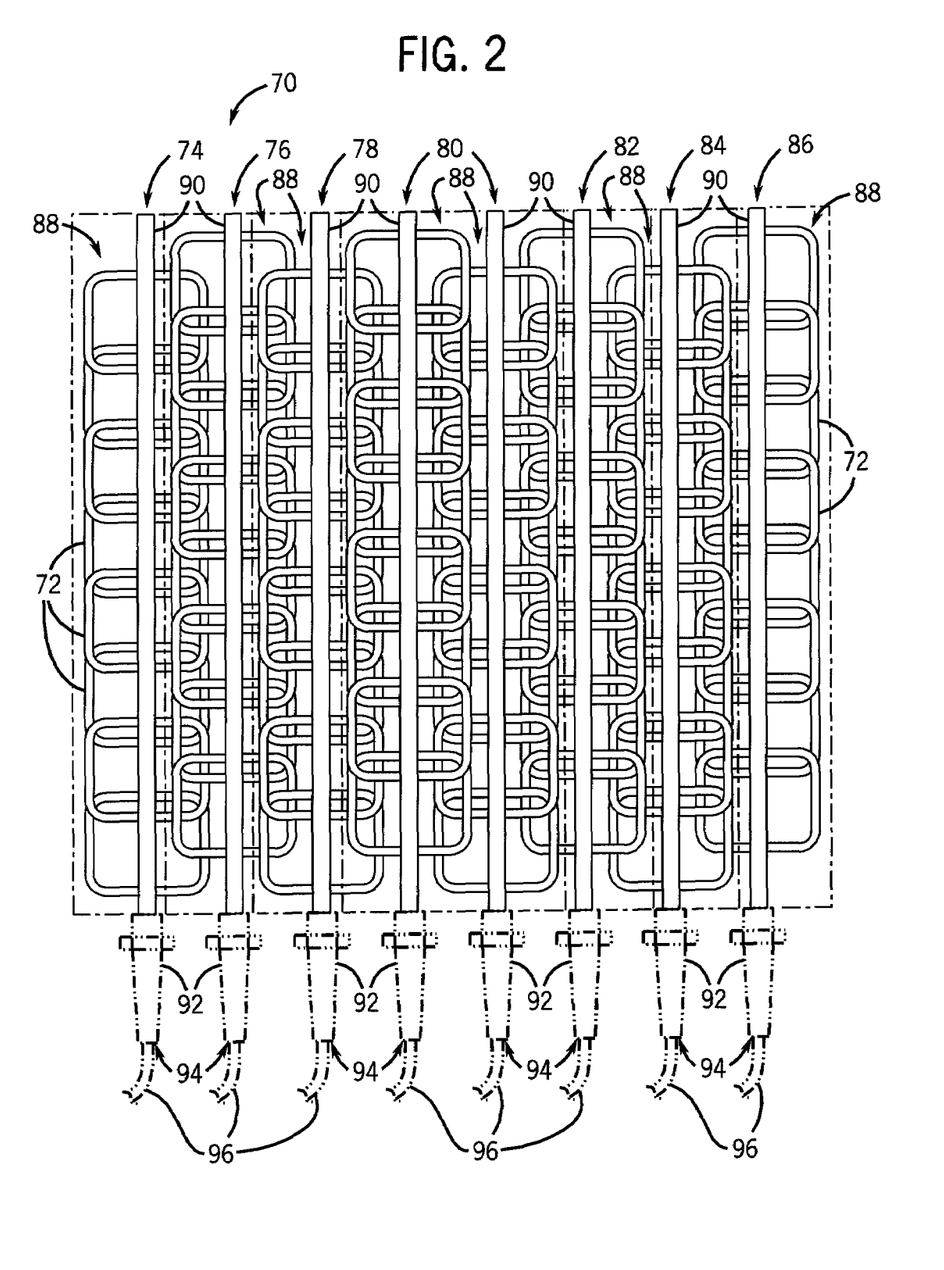
FIG. 2 is a schematic diagram of an RF coil array according to one embodiment of the present invention.

FIG. 2 shows a schematic diagram of an RF coil array 70 according to one embodiment of the present invention. RF coil array 70 includes a plurality of RF coils 72 positioned relative to each other such that a mutual inductance between each nearest-neighbor coil 72 is minimized. Preferably, the mutual inductance between coils 72 is zero. RF coil array 70 includes a plurality of modules 74-86 rotatably interconnected to each other. Each module 74-78, 82-86 has a column 88 of overlapping RF coils 72. Center module 80 has two columns 88 of overlapping RF coils 72 attached thereto. Each column 88 of RF coils 72 is attached to a rib 90 having a plurality of electrical components (shown in FIG. 3) for each RF coil circuit in the column 88. An end connector 92 having a passage 94 therethrough is connected to each rib 90. Wires 96 are routed through the passage 94 and connect each RF coil circuit to the MR system 10 of FIG. 1.

Figure 3:
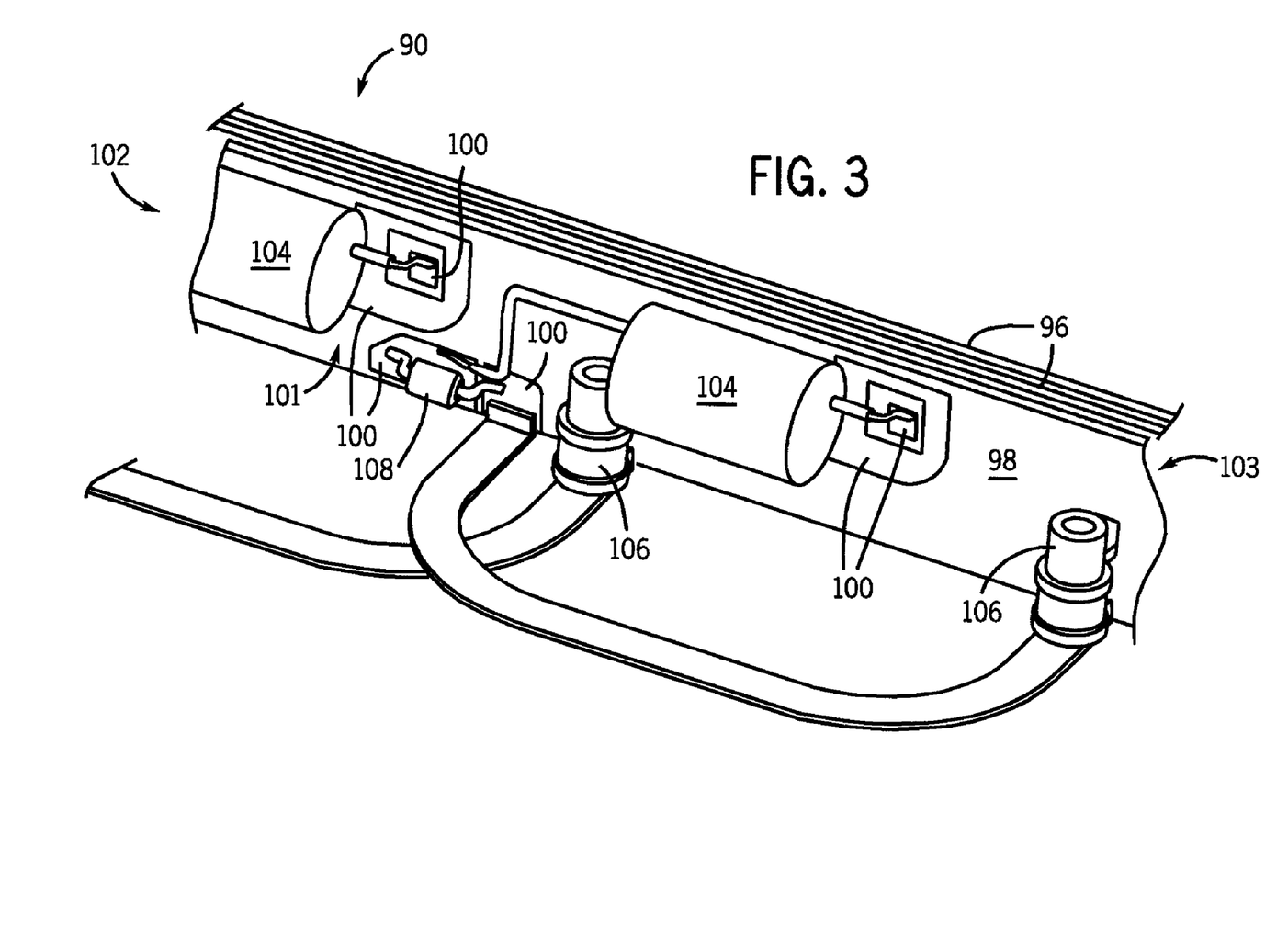
FIG. 3 is a perspective view of a portion of a rib of the RF coil array of FIG. 2 in accordance with an embodiment of the present invention.

FIG. 3 shows a perspective view of a portion of a module 74-86 of FIG. 2 in accordance with an embodiment of the present invention. In a preferred embodiment, rib 90 is a printed circuit board (PCB) 98 having a plurality of electrical circuits 100 on one side 101. However, the plurality of electrical circuits 100 may also be etched on two sides 101, 103 of PCB 98. Alternatively, it is contemplated that rib 90 may constructed of a lightweight material and that a separate PCB or equivalently etched substrate may be attached thereto. The plurality of electrical circuits 100 include components 102 such as a balun 104, a variable capacitor 106, and a diode 108 electrically connected to each RF coil 72. One skilled in the art will recognize that, while one variable capacitor 106 and one diode 108 are shown in FIG. 3, more than one variable capacitor 106 and more than one diode 108 may be connected to each RF coil 72. Wires 96 further connect each electrical circuit 100 to a preamplifier 64 (FIG. 1) and relay signals received by the RF coils 72 through the plurality of end connectors 92 (FIG. 2) to the system control 32 (FIG. 1). The ribs 90 provide structural support for the electrical circuits 100 and any solder joints between them, and further protect the electrical circuits 100 during flexing of the coil assembly.

Figure 4:
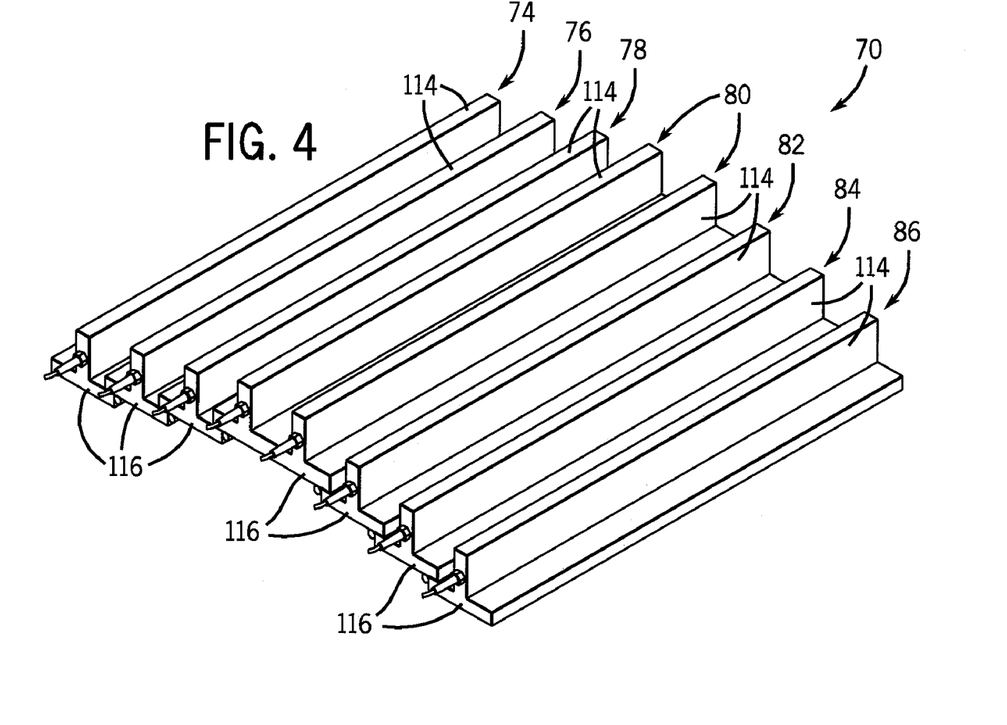
FIG. 4 is a perspective view of the RF coil array 70 of FIG. 2 having the modules 74-86 protectively covered.

FIG. 4 shows a perspective view of the RF coil array 70 of FIG. 2 having the modules 74-86 protectively covered. Each rib 90 includes a tent, or cover, 114 to shield the electrical circuits 100 and components 102 (FIG. 3) from contact with another object that may disturb or dislodge the electrical circuits 100 and components 102, which may cause an RF coil circuit to malfunction. A basal support 116 surrounds and supports each column 88 of modules 74-78, 82-86 and both columns 88 of module 80 such that the RF coils 72 in each column 88 remain substantially planar as the basal support 116 is rotated with respect to its neighbor. In one embodiment, basal support 116 is constructed of a multi-layer printed circuit board, and the RF coils 72 in each column 88 are etched thereon. In another embodiment, the RF coils 72 in each column 88 may be formed from loops of wire or electrical conductors, and positioned within basal support 116.

Figures 5, 6:
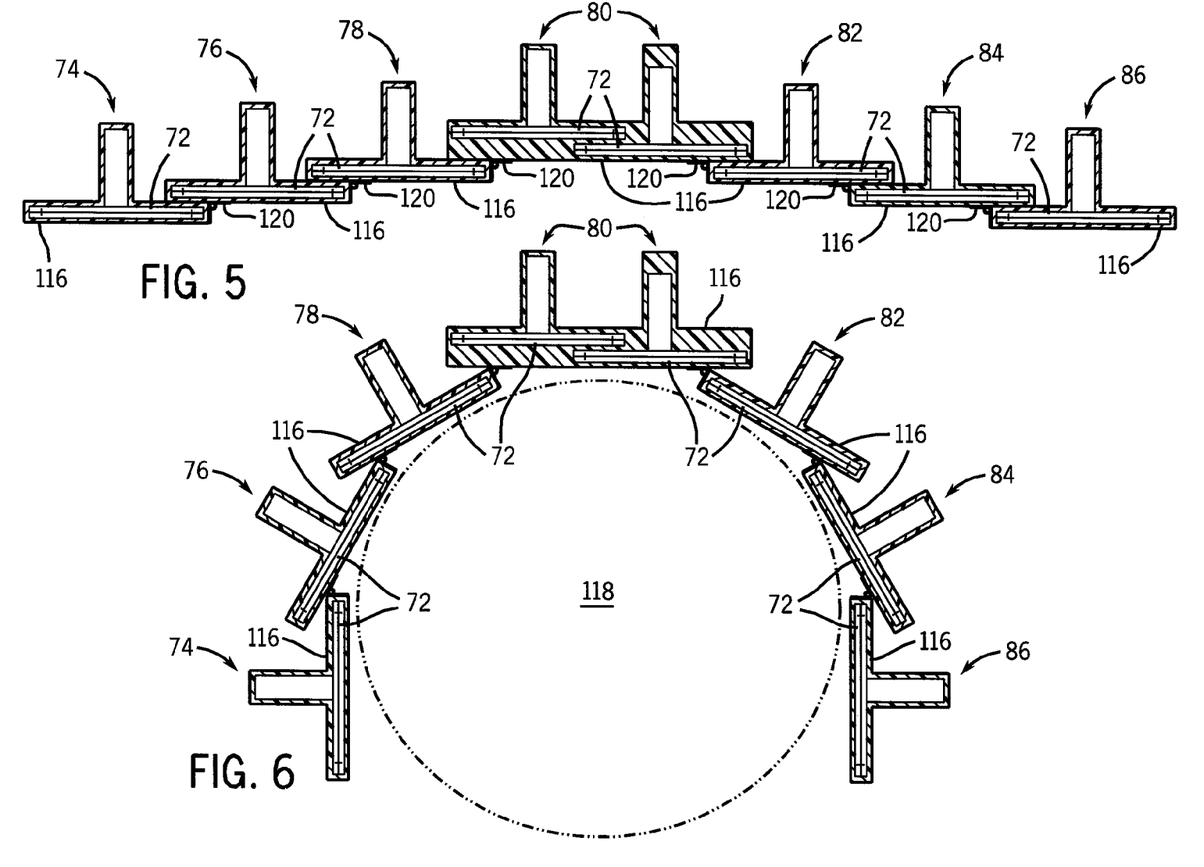
FIG. 5 is a side plan view of the RF coil array of FIG. 2 in an unflexed position according to an embodiment of the present invention.
FIG. 6 is a side plan view of RF coil array of FIG. 2 in a flexed position according to an embodiment of the present invention.

Referring to FIG. 5, a side plan view of RF coil array 70 in an unflexed position according to an embodiment of the present invention is shown. As illustrated, each basal support 116 is offset from its neighbors such that the RF coils 72 protected therein are positioned substantially parallel to, but above and/or below the RF coils 72 of neighboring basal supports 116. As shown in FIG. 5, each module 74-86 is connected to its neighbor via a hinge 120. In a preferred embodiment, hinge 120 is a piano hinge. Alternatively, hinge 120 is a cam hinge system described below. It is contemplated, however, that other suitable hinges, such a butt hinge and the like, may also be used.

FIG. 6 shows a side plan view of RF coil array 70 in a flexed position about an imaging object 118, such as a human torso, according to an embodiment of the present invention. As shown, each basal support 116 rotates with respect to adjacent supports 116 such that each column 88 of RF coils 72 remains in a substantially planar state. Accordingly, flexing of the RF coil array 70 allows the RF coil array 70 to follow the contour of the imaging object 118 while the RF coils 72 of each module 74-86 are rigidly supported such that flex stresses on each RF coil 72 is minimized.

Figure 7:
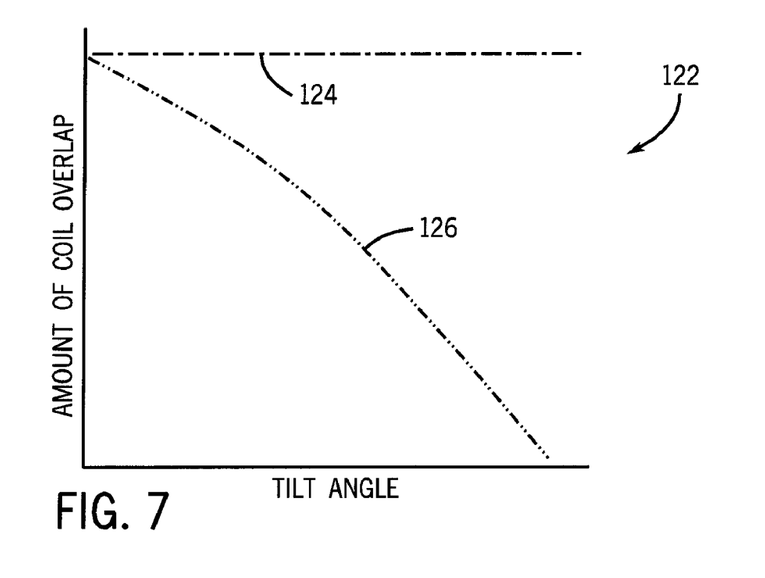
FIG. 7 is an exemplary RF coil displacement plot illustrating a displacement of the RF coils during rotation.

FIG. 7 shows an RF coil displacement diagram 122 illustrating coil displacement curves 124, 126 of the amount of coil overlap versus tilt, or rotation, angle of the basal supports 116 to achieve a minimum inductance between nearest-neighbor RF coil columns 88. The mutual inductance between nearest-neighbor RF coil columns 88 may remain constant or may vary between rotation angles based on the geometry of the RF coil array 70. Coil displacement curve 124 shows that the amount of overlap, in one geometry, remains substantially constant as the tilt angle between nearest-neighbor basal supports 116 varies. As such, a non-translating hinge, such as hinge 120, may be used to interconnect nearest-neighbor basal supports 116. However, coil displacement curve 126 shows that the amount of overlap, in another geometry, must change as the tilt angle between nearest-neighbor basal supports 116 varies such that the mutual inductance between nearest-neighbor RF coil columns 88 may be minimized.

Figure 8:
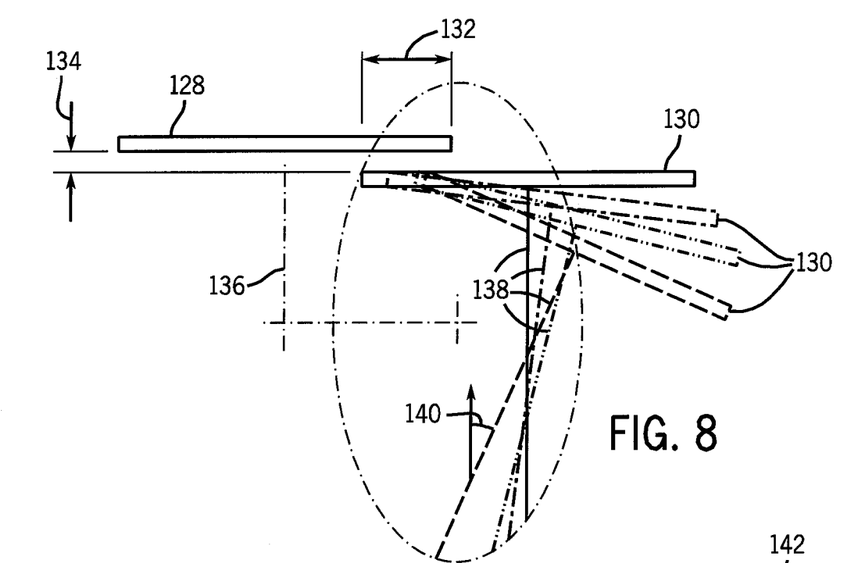
FIG. 8 is a schematic diagram showing rotation and translation of a pair of RF coils with respect to each other coil according to an embodiment of the present invention.

FIG. 8 shows a side schematic diagram of a pair of RF coil columns 128, 130 showing rotation and translation of one column 130 with respect to the other column 128. RF coil columns 128, 130 are partially overlapped, as indicated by arrows 132, and spaced apart, or distanced, as indicated by arrows 134, as discussed above, to minimize mutual inductance therebetween. In a parallel arrangement of RF coil columns 128, 130, respective axes 136, 138, orthogonal to a plane of the RF coil columns 128, 130, are also in parallel. As indicated by coil displacement curve 126 of FIG. 7, as the tilt 140 angle between RF coil columns 128, 130 varies, a translation of RF coil column 128 relative to RF coil column 130 occurs such that the amount of overlap 132 changes. In this manner, the mutual inductance between RF coil columns 128, 130 during rotation may be kept at a minimum. Preferably, the distance 134 between RF coil columns 128, 130 remains constant during rotation. However, it is contemplated that the distance 134 may vary in combination with the amount of overlap 132 to minimize the mutual inductance between RF coil columns 128, 130 during rotation.

Figure 9:
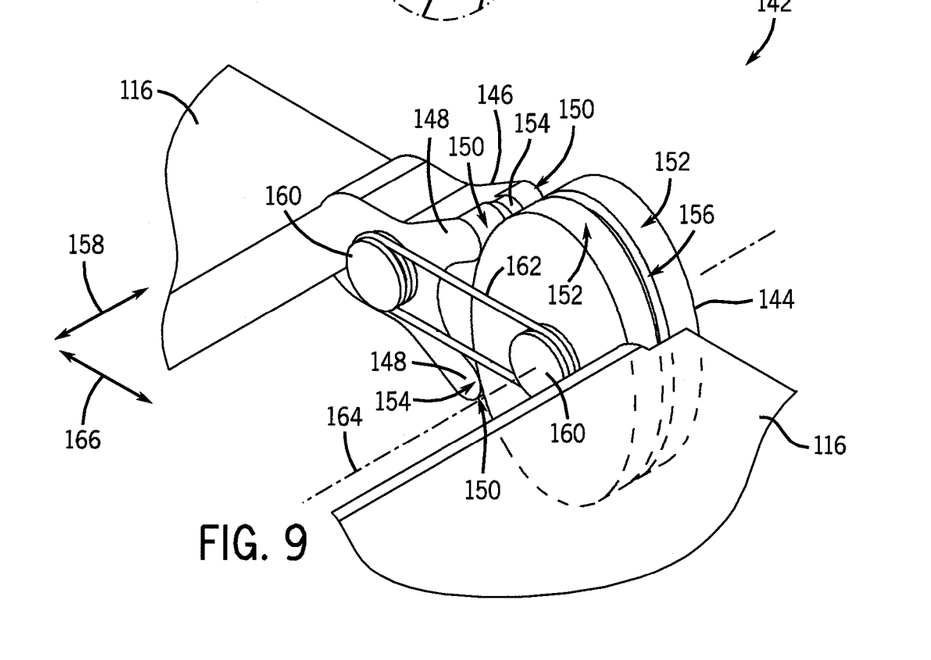
FIG. 9 is a perspective view of a cam system usable with the RF coil array of FIG. 2 in accordance with one embodiment of the present invention.

FIG. 9 shows a perspective view of a cam hinge system 142 in accordance with an embodiment of the present invention capable of translating RF coil columns 128, 130 as described above with respect to FIG. 8. The cam hinge system 142 includes a cam 144 configured to be connected to one basal support 116 and a cam follower 146 configured to be connected to a neighboring basal support 116. In a preferred embodiment, cam follower 146 includes a pair of arms 148 having sliding contact surfaces 150 that slidingly engage sliding contact surfaces 152 of cam 144. Further, cam follower 146 preferably includes a pair of tongues 154 extending from the pair of arms 148 into a groove 156 formed in cam 144. The pair of tongues 154 and the groove 156 form a guide system that maintains a constant lateral position of the one basal support 116 to the other basal support 116 in a lateral direction 158.

Cam 144 and cam follower 146 each further include a knob 160 extending in a same direction such that an elastic member 162, such as a spring, a rubber band, and the like, interconnects the knobs 160 together to maintain engagement of the sliding contact surfaces 150, 152 to each other. In a preferred embodiment, the knob 160 of cam 144 is concentric with an axis of rotation 164 of cam 144. In this manner, as the cam 144 and cam follower 146 rotate with respect to each other, the sliding contact surfaces 152 of cam 144 cause translation of the knobs 160 with respect to each other, and hence, the respective basal supports 116 connected thereto, along a translation direction 166. In a preferred embodiment, a pair of cam hinge systems 142 rotatably interconnects each pair of neighboring basal supports 116 of modules 74-86.

The cam hinge system 142 is designed such that displacement of the cam 144 and cam follower 146 causes translational displacement of neighboring RF coil columns 128, 130 according to a desired displacement curve, such as the displacement curve 126 of FIG. 7. As shown in FIGS. 8 and 9, cam 144 is oval. It is contemplated, however, that the shape of cam 144 and the position of the pair of arms 148 of cam follower 146 may vary from that shown such that translation of the RF coil columns 128, 130 during rotation follows the desired displacement curve.

Figure 10:
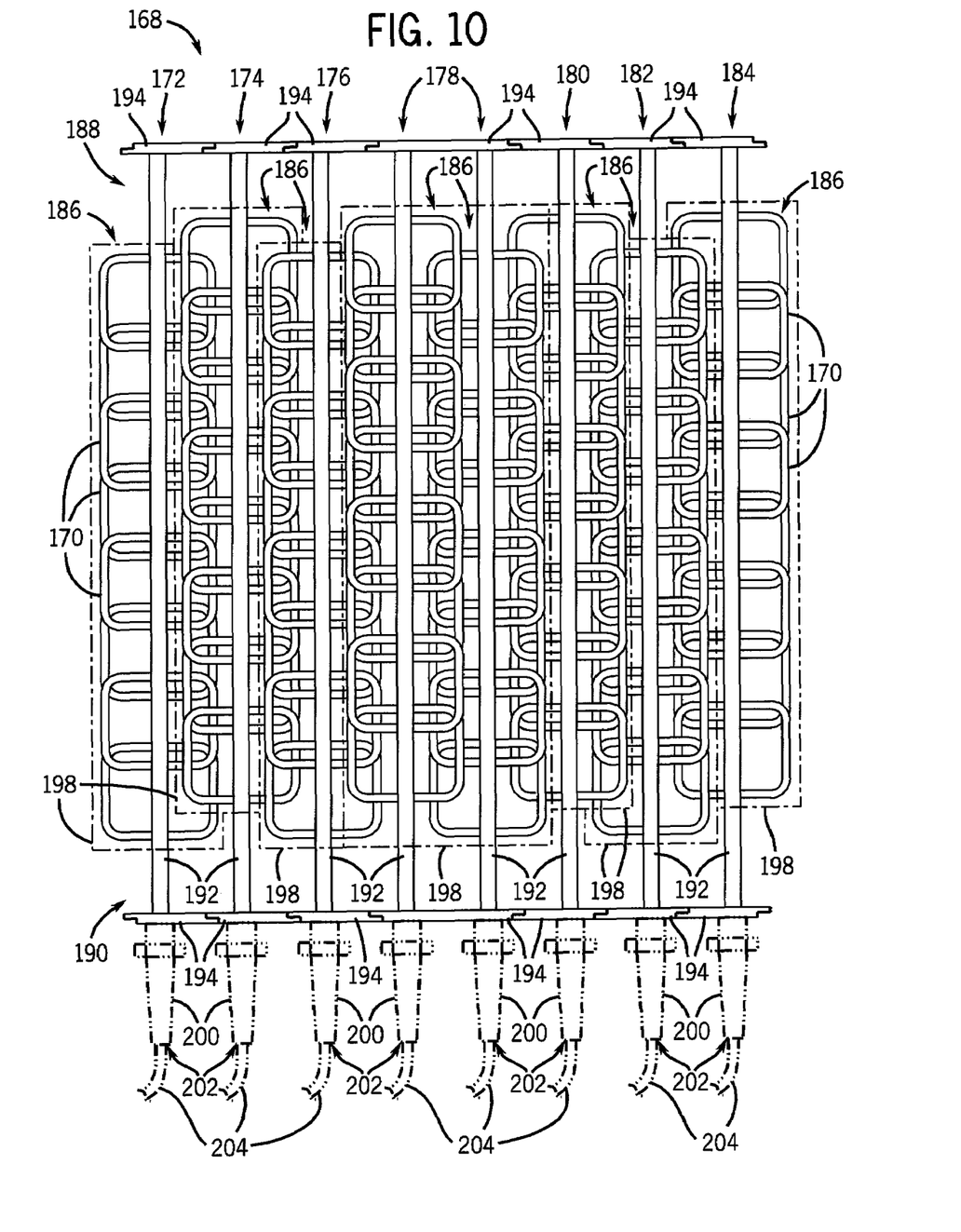
FIG. 10 is a schematic diagram of an RF coil array according to another embodiment of the present invention.

FIG. 10 shows a schematic diagram of an RF coil array 168 according to another embodiment of the present invention. RF coil array 168 includes a plurality of RF coils 170 positioned relative to each other such that a mutual inductance between each nearest-neighbor coil 170 is minimized. Preferably, the mutual inductance between coils 170 is zero.

RF coil array 168 includes a plurality of supports 172-184 rotatably interconnected to each other. Each support 172-184 has a column 186 of overlapping RF coils 170 attached thereto. In addition, each support 172-184 includes a rib assembly 192 and a pair of end members or links 194 attached to ends 188, 190 of the rib 194. Ribs 192 are constructed in a manner similar to that described above with respect to FIG. 3. Links 194 are preferably constructed of a lightweight and sturdy material to increase patient comfort and durability, such as ULTEM®, polycarbonates, or other suitable materials. ULTEM® is a registered trademark of General Electric Company of Schenectady, N.Y.

A base housing 198 surrounds each column 186 of overlapping RF coils 170. The base housing 198 provides additional structural support, protects each column 186 of overlapping RF coils 170 from repeated flexing, and protects a patient from coming into contact with any of the coils 170.

An end connector 200 connects to an end 190 of each support 172-184. Each end connector 200 has a passage 202 therethrough such that wires 204 connected to the RF coils 170 and electrical circuits 100 (FIG. 3) may be routed through the end connector 200.

Figures 11, 12:
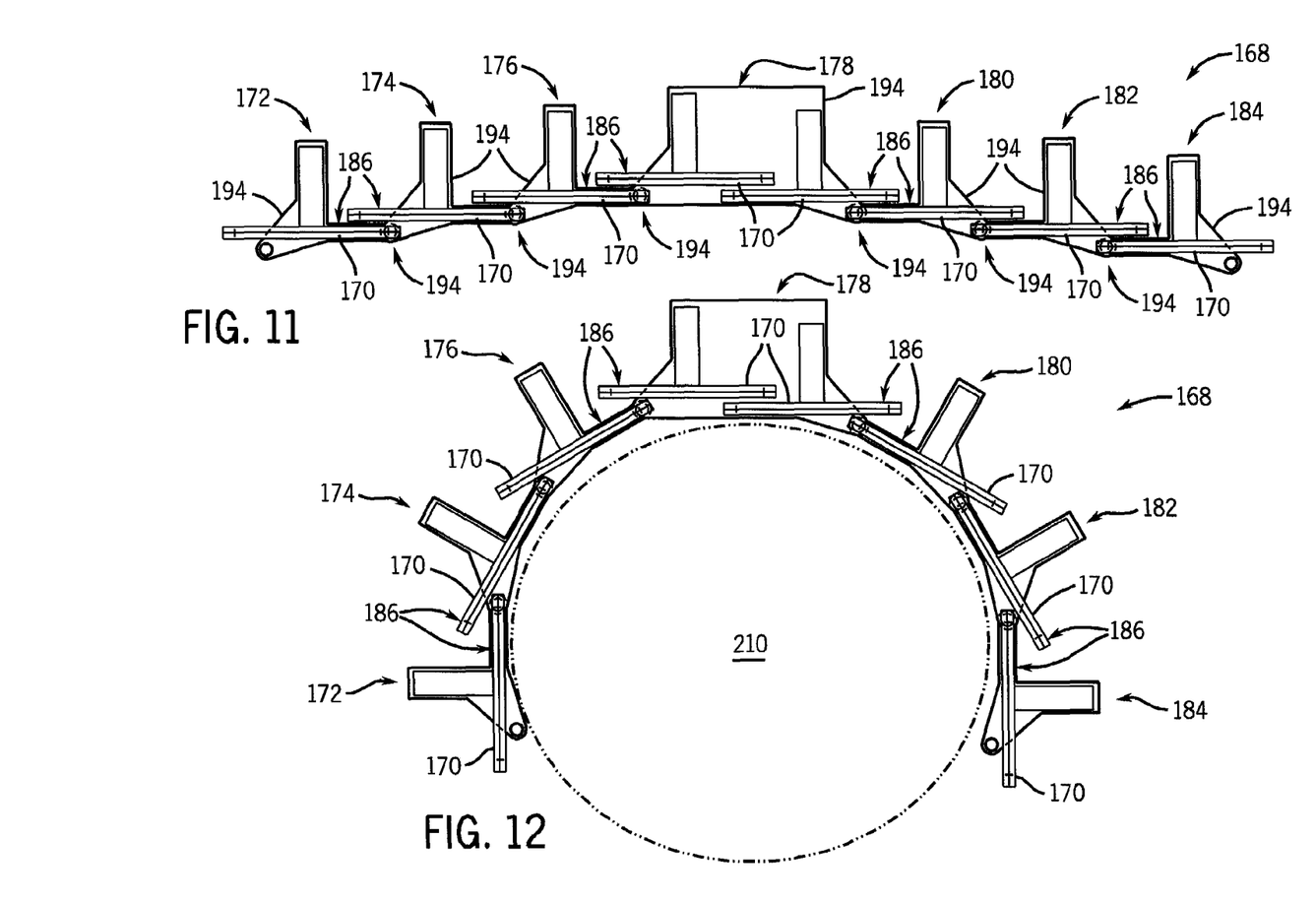
FIG. 11 is a side plan view of the RF coil array of FIG. 10 in an unflexed position according to an embodiment of the present invention.
FIG. 12 is a side plan view of the RF coil array of FIG. 10 in a flexed position according to an embodiment of the present invention.

Referring to FIG. 11, a side plan view of RF coil array 168 in an unflexed position according to an embodiment of the present invention is shown. As illustrated, each column 186 of overlapping RF coils 170 is offset from its neighbors such that the RF coils 170 in each column 186 are positioned substantially parallel to, but above and/or below the columns 186 of RF coils 170 of its neighbors. Each pair of links 194 rotatably connects to an adjacent pair of links 194 with a hinge system as described above.

FIG. 12 shows a side plan view of RF coil array 168 in a flexed position about an imaging object 210, such as a human torso, according to an embodiment of the present invention. As shown, each supports 172-184 rotates with respect to adjacent supports 172-184 such that each column 186 of RF coils 170 remains in an unflexed state. Accordingly, flexing of the RF coil array 168 allows the RF coil array 168 to follow the contour of the imaging object 210 while minimizing flex stresses on the RF coils 170.

An RF coil array constructed according to the present invention allows the array to flex about an axis axial to a subject of interest. In this manner, the RF coil array may be wrapped around at least a portion of the subject of interest, such as a human torso or extremity. The array constructed according to the present invention provides protection to RF coils and their supporting electrical components such that repeated flexing of the RF coils and components themselves is minimized.

Therefore, according to an embodiment of the present invention, an MRI apparatus includes a magnetic resonance imaging (MRI) system having a plurality of gradient coils positioned about a bore of a magnet to impress spatially dependent changes to a polarizing magnetic field and an RF transceiver system and an RF switch controlled by a pulse module to transmit RF magnetic fields from an RF transmit coil to excite MR signals and to acquire MR signals using an RF receiver coil assembly to create MR images. The RF coil assembly includes a pair of RF coil modules. Each RF coil module includes a set of overlapping RF coils and a housing rigidly supporting the set of overlapping RF coils. The RF coil assembly includes at least one hinge connected to each of the pair of RF coil modules and configured to permit the pair of RF coil modules to rotate between an unflexed position and a flexed position.

According to another embodiment of the present invention, an RF coil assembly includes a plurality of RF coil sets. The assembly also includes a plurality of RF coil modules rotatably interconnected to each other, each RF coil module rigidly connected to one of the plurality of RF coil sets and configured to rotate with respect to at least one adjoining RF coil module.

According to a further embodiment of the present invention, a method of making an RF coil array includes connecting a first plurality of RF coils to a first rigid support and connecting a second plurality of RF coils to a second rigid support. The method also includes attaching at least one hinge between the first and second rigid supports.

The present invention has been described in terms of the preferred embodiment, and it is recognized that equivalents, alternatives, and modifications, aside from those expressly stated, are possible and within the scope of the appending claims.

What is claimed is:

1. An MRI apparatus comprising:
   a magnetic resonance imaging (MRI) system having a plurality of gradient coils positioned about a bore of a magnet to impress spatially dependent changes to a polarizing magnetic field and an RF transceiver system and an RF switch controlled by a pulse module to transmit RF magnetic fields from an RF transmit coil to excite MR signals and to acquire MR signals using an RF receiver coil assembly to create MR images, the RF coil assembly comprising:
   a pair of RF coil modules, each RF coil module comprising:
   a set of overlapping RF coils; and
   a housing rigidly supporting the set of overlapping RF coils; and
   at least one hinge connected to each of the pair of RF coil modules and configured to permit the pair of RF coil modules to rotate between an unflexed position and a flexed position;
   wherein each of the pair of RF coil modules further comprises:
   a rib attached thereto; and
   a plurality of electrical components for each RF coil in the set of overlapping RF coils; and,
   wherein the rib comprises a printed circuit board of at least one side, having an electrical circuit for each RF coil in the set of overlapping RF coils, and wherein the plurality of electrical components for each RF coil is electrically connected to a corresponding electrical circuit.

2. The MRI apparatus of claim 1 further comprising a rigid housing configured to enclose the rib and the plurality of electrical components connected thereto.

3. The MRI apparatus of claim 1 wherein the RF coil assembly further comprises an end connector attached to each rigid housing enclosing a rib, the end connector having a passage therethrough configured to guide a plurality of wires onto a corresponding rib, each wire electrically connected to a corresponding electrical circuit.

4. The MRI apparatus of claim 1 wherein the plurality of electrical components comprises a preamplifier, a balun, at least one capacitor, and at least one diode.

5. The MRI apparatus of claim 1 wherein each of the pair of RF coil modules further comprises:
   a first link connected to a first end of the rib;
   a second link connected to a second end of the rib; and
   wherein the at least one hinge comprises:
      a first hinge connected to the first link of one of the pair of RF coil modules and connected to the first link of the other of the pair of RF coil modules; and
      a second hinge connected to the second link of one of the pair of RF coil modules and connected to the second link of the other of the pair of RF coil modules.

6. The MRI apparatus of claim 1 wherein the housing comprises a printed circuit board having at least one side, and wherein the set of overlapping RF coils is etched on the printed circuit board.

7. The MRI apparatus of claim 1 wherein the at least one hinge is one of a piano hinge and a butt hinge.

8. The MRI apparatus of claim 1 wherein the at least one hinge is a cam hinge system comprising:
   a cam; and
   a cam follower configured to mate with the cam
   wherein the cam has a groove formed therein and wherein the cam follower comprises at least one projection configured to engage the groove the cam further comprises a knob extending from a surface thereof and configured to engage a first portion of an elastic member, and wherein the cam follower further comprises a knob extending from a surface thereof and configured to engage a second portion of the elastic member.

9. The MRI apparatus of claim 1 wherein at least one hinge is connected to each housing of the pair of RF coil modules.

10. An RF coil assembly comprising:
    a plurality of RF coil sets;
    a plurality of RF coil modules rotatably interconnected to each other, each RF coil module rigidly connected to one of the plurality of RF coil sets and configured to rotate with respect to at least one adjoining RF coil module; and, a hinge system connected to adjoining RF coil modules and configured to allow the adjoining RF coil modules to rotate with respect to each other, wherein the hinge system is a cam hinge system comprising:
   a cam attached to one of the adjoining RF coil modules; and
   a cam follower configured to mate with the cam and attached to the other of the adjoining RF coil modules.

11. The RF coil assembly of claim 10 wherein the cam hinge system is configured to vary an overlap of adjacent edges of the adjoining RF coil modules as the adjoining RF coil modules rotate with respect to each other.

12. The RF coil assembly of claim 10 wherein each RF coil module is further configured to maintain the RF coil set connected thereto in an unflexed state during rotation thereof with respect to the at least one adjoining RF coil module.

13. A method of making an RF coil array comprising the steps of:
   connecting a first plurality of RF coils to a first rigid support;
   connecting a second plurality of RF coils to a second rigid support; and
   attaching at least one hinge between the first and second rigid supports;
   wherein the step of attaching further comprises:
      attaching a cam interface to the first rigid support:
      attaching a cam follower interface to the second rigid support; and
      interconnecting the cam interface to the cam follower interface.

14. The method of claim 13 wherein the step of attaching further comprises attaching one of a piano hinge and a butt hinge between the first and second rigid supports.

15. The method of claim 13 further comprising the steps of:
   forming a portion of each of the first and second rigid supports from a printed circuit board of at least one side;
   electrically connecting a respective RF coil to an electrical circuit on the printed circuit board; and
   electrically connecting a plurality of electrical components to each respective RF coil.

\* \* \* \* \*

UNITED STATES PATENT AND TRADEMARK OFFICE
CERTIFICATE OF CORRECTION

PATENT NO.          : 7,365,542 B1
APPLICATION NO. : 11/554951
DATED                  : April 29, 2008
INVENTOR(S)        : Rohling et al.

Page 1 of 1

It is certified that error appears in the above-identified patent and that said Letters Patent is hereby corrected as shown below:

In Column 8, Line 2, in Claim 1, delete "perm it" and insert -- permit --, therefor.

In Column 10, Line 4, in Claim 13, delete "support:" and insert -- support; --, therefor.

Signed and Sealed this

Fourteenth Day of July, 2009

JOHN DOLL
*Acting Director of the United States Patent and Trademark Office*